(12) United States Patent
Daggolu et al.

(10) Patent No.: US 10,487,418 B2
(45) Date of Patent: Nov. 26, 2019

(54) SEED CHUCK ASSEMBLIES AND CRYSTAL PULLING SYSTEMS FOR REDUCING DEPOSIT BUILD-UP DURING CRYSTAL GROWTH PROCESS

(71) Applicant: SunEdison Semiconductor Limited (UEN201334164H), Singapore (SG)

(72) Inventors: Parthiv Daggolu, Creve Coeur, MO (US); Benjamin Michael Meyer, Defiance, MO (US); William L. Luter, St. Charles, MO (US); Soubir Basak, Chandler, AZ (US); Sumeet S. Bhagavat, St. Charles, MO (US); Nan Zhang, O'Fallon, MO (US); Gaurab Samanta, St. Louis, MO (US)

(73) Assignee: GlobalWafers Co., Ltd., Taiwan (TW)

(*) Notice: Subject to any disclaimer, the term of this patent is extended or adjusted under 35 U.S.C. 154(b) by 0 days.

(21) Appl. No.: 15/399,390

(22) Filed: Jan. 5, 2017

(65) Prior Publication Data
US 2017/0191182 A1   Jul. 6, 2017

Related U.S. Application Data

(60) Provisional application No. 62/275,448, filed on Jan. 6, 2016.

(51) Int. Cl.
*C30B 15/32* (2006.01)
*C30B 29/06* (2006.01)

(52) U.S. Cl.
CPC .............. *C30B 15/32* (2013.01); *C30B 29/06* (2013.01)

(58) Field of Classification Search
CPC ......... C30B 15/00; C30B 15/14; C30B 15/20; C30B 15/22; C30B 15/24; C30B 15/32;
(Continued)

(56) References Cited

U.S. PATENT DOCUMENTS 4,956,153 A * 9/1990 Yamagishi .............. C30B 15/14
117/217
5,316,742 A    5/1994 Tomioka et al.
(Continued)

FOREIGN PATENT DOCUMENTS

JP           09-208383     * 12/1997
JP     WO 2014/208000 A1 * 12/2014
WO         2014106080 A1    7/2014

OTHER PUBLICATIONS

Liu, Xin et al., Analysis of Argon Flow on Mass Transport in a CZ-Si Crystal Growth by Using Full Compressible Flow Solver, 17th International Conference on Crystal Growth and Epitaxy—ICCGE-17, Topical Session 5, Aug. 16, 2013, Abstract, http://science24.com/paper/28852.
(Continued)

*Primary Examiner* — Kenneth A Bratland, Jr.
(74) *Attorney, Agent, or Firm* — Armstrong Teasdale, LLP

(57) ABSTRACT

Crystal pulling systems for growing monocrystalline ingots from a melt of semiconductor or solar-grade material are described. The crystal pulling systems include seed chuck assemblies designed to reduce formation of deposits on components of the crystal pulling systems by reducing and inhibiting the formation of gas flow recirculation cells within the crystal pulling systems.

19 Claims, 9 Drawing Sheets

(58) Field of Classification Search
CPC ......... C30B 29/00; C30B 29/02; C30B 29/06; Y10T 117/00; Y10T 117/10; Y10T 117/1016; Y10T 117/1024; Y10T 117/1032; Y10T 117/106; Y10T 117/1068; Y10T 117/1072
USPC ........ 117/200, 204, 206, 208, 217–218, 911, 117/928, 931–932
See application file for complete search history.

(56) References Cited

U.S. PATENT DOCUMENTS

| | | | |
|---|---|---|---|
| 5,476,065 A | | 12/1995 | Ikezawa et al. |
| 5,795,383 A | | 8/1998 | Okamoto et al. |
| 5,827,367 A | * | 10/1998 | Wijaranakula ......... C30B 15/00 117/208 |
| 5,993,902 A | | 11/1999 | Heid |
| 6,036,776 A | * | 3/2000 | Kotooka ................ C30B 15/14 117/217 |
| 8,152,921 B2 | | 4/2012 | Anttila et al. |
| 8,641,820 B2 | | 2/2014 | Anttila et al. |
| 2008/0110394 A1 | | 5/2008 | Noda et al. |
| 2010/0212580 A1 | * | 8/2010 | Kawazoe ................ C30B 15/04 117/19 |
| 2010/0258050 A1 | * | 10/2010 | Hoshi .................... C30B 15/14 117/217 |
| 2016/0115620 A1 | * | 4/2016 | Takazawa ............... C30B 15/00 117/13 |

OTHER PUBLICATIONS

Liu, Xin et al., Numerical investigation of carbon contamination during the melting process of Czochralski silicon crystal growth, Journal of Crystal Growth, 2014, pp. 1-7, http://dx.doi.org/10.1016/j.jcrysgro.2014.07.040.

Choe, K. S. et al., Pregrowth Ambient Gas Analysis of Czochralski Si Crystal Puller, Journal of Electrochemical Society, 1988, vol. 135, Issue 3, Abstract, http://jes.ecsdl.org/content/135/3/706.short.

Machida, Norihisa et al., The effects of argon gas flow rate and furnace pressure on oxygen concentration in Czochralski-grown silicon crystals, Journal of Crystal Growth, Mar. 1988, vol. 186, Issue 3, Abstract, http://www.researchgate.net/publication/239703855.

Ren, Bingyan et al., Effects of argon gas flow rate and guide shell on oxygen concentration in Czochralski silicon growth, Rare Metals, Feb. 2006, vol. 25, Issue 1, Abstract, http://www.researchgate.net/publication/248115524.

Nagai, Yuta et al., Growth of Czochralski Silicon Crystals with Ultrlow Carbon Concentrations for High-Power Insultated-Gate Bipolar Transistor Devices, ECS Transactions, 2014, vol. 64, Issue 11, pp. 3-11.

* cited by examiner

SEED CHUCK ASSEMBLIES AND CRYSTAL PULLING SYSTEMS FOR REDUCING DEPOSIT BUILD-UP DURING CRYSTAL GROWTH PROCESS

CROSS-REFERENCE TO RELATED APPLICATIONS

This application claims priority to U.S. Provisional Patent Application Ser. No. 62/275,448, filed Jan. 6, 2016, the disclosure of which is hereby incorporated by reference in its entirety.

FIELD

The field of the disclosure relates generally to systems for producing ingots of semiconductor or solar-grade material from a melt and, more particularly, to systems for controlling gas flow and deposition of evaporated species when producing single crystal ingots of semiconductor or solar-grade material doped with volatile dopants.

BACKGROUND

Single crystal material, such as single crystal silicon, is the starting material for fabricating many electronic components, such as semiconductor devices and solar cells. Single crystal silicon is commonly prepared using the Czochralski ("CZ") method. Briefly, the Czochralski method involves melting polycrystalline source material, such as polycrystalline silicon ("polysilicon"), in a crucible to form a silicon melt, lowering a seed crystal into contact with the melt to initiate crystal growth, and then pulling a single-crystal ingot from the melt. Suitable amounts of dopants are added to the melt prior to and/or during the growth process to modify the base resistivity of the resulting monocrystalline ingot. The type and amount of dopant is selected based on the intended end-use of the single crystal material.

Electronic devices fabricated from single crystal silicon include, for example and without limitation, power discrete devices, such as power MOSFETs and power bipolar devices. Unlike conventional CMOS devices, where current flow is confined to a few microns below the silicon surface where device channels are formed, power discrete devices require current flow through the entire thickness of the device. It is therefore desirable to fabricate power discrete devices on relatively low resistivity substrates to reduce power consumption.

For certain applications, such as power discrete devices, it is desirable to grow monocrystalline ingots having relatively low resistivities (e.g., less than 100 milliohm-centimeters (m$\Omega$-cm). To achieve such low resistivities, a relatively large amount or high concentration of dopant (e.g., dopant concentrations in excess of $5 \times 10^{17}$ atoms per cubic centimeter) is added to the melt from which the monocrystalline ingot is grown.

Doping a melt with a relatively large amount of dopant presents several challenges to producing single crystal ingots using the Czochralski growth method, particularly where the dopants are volatile dopants (e.g., indium) or dopants that form highly volatile complexes with oxygen (e.g., phosphorus, arsenic, and antimony). For example, doping a melt with large amounts of these dopants may enhance the evaporation of oxygen species from the melt as dopant oxides and suboxides, in addition to oxides and suboxides of silicon, which may condense and deposit on components of the crystal pulling system, such as the upper dome or the receiving chamber. These deposits may subsequently fall into the melt during the ingot growth process, and result in particulate induced loss of structure or zero dislocation growth and failure of a CZ batch, thereby reducing the yield of the crystal growth process. Additionally, particulate deposits can form on view ports of crystal pulling systems, typically located on the upper dome of such systems, and impede an operator's ability to monitor the crystal growth process.

Accordingly, a need exists for a crystal pulling system that prevents or inhibits formation of deposits of evaporated species on components of crystal pulling systems, such as the upper dome and the ingot receiving chamber This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a crystal pulling system for growing a monocrystalline ingot from a melt of semiconductor or solar-grade material includes a housing that defines a growth chamber, a crucible disposed within the growth chamber for containing the melt of semiconductor or solar-grade material, a pulling mechanism configured to pull the ingot from the melt, a vertically-extending baffle disposed within the growth chamber and having an inner diameter defining a central passage for receiving the ingot as the ingot is pulled by the pulling mechanism, and a seed chuck assembly connected to the pulling mechanism. The seed chuck assembly has an outer diameter, and a ratio between the outer diameter of the seed chuck assembly and the inner diameter of the baffle is in the range of 0.6 to 1.0.

In another aspect, a crystal pulling system for growing a monocrystalline ingot from a melt of semiconductor or solar-grade material includes a crucible for containing the melt of semiconductor or solar-grade material, a pulling mechanism configured to pull the ingot from the melt, and a seed chuck assembly connected to the pulling mechanism. The seed chuck assembly includes a main body and a flow guide connected to and disposed radially outward from the main body such that a flow passage is defined between the flow guide and the main body.

In yet another aspect, a crystal pulling system for growing a monocrystalline ingot from a melt of semiconductor or solar-grade material includes a housing that defines a growth chamber, a crucible disposed within the growth chamber for containing the melt of semiconductor or solar-grade material, a pulling mechanism configured to pull the ingot from the melt, a cooling jacket disposed within the growth chamber and having an inner diameter defining a central passage for receiving the ingot as the ingot is pulled by the pulling mechanism, and a seed chuck assembly connected to the pulling mechanism. The seed chuck assembly includes a main body and a flow guide connected to and disposed radially outward from the main body such that a flow passage is defined between the flow guide and the main body. The flow guide includes a lower conical portion, an upper conical portion, and a cylindrical mid-portion extending between the upper conical portion and the lower conical portion and defining an outer diameter of the seed chuck assembly. A ratio between the outer diameter of the seed chuck assembly and the inner diameter of the cooling jacket is in the range of 0.6 to 0.85.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Embodiments of the systems described herein facilitate improving the yield of low-resistivity monocrystalline semiconductor ingots doped with volatile dopants, such as, but not limited to, antimony, arsenic and red phosphorus. In particular, embodiments of the systems described herein facilitate reducing the formation of deposits on components of crystal pulling systems used to grow such ingots, which might otherwise result in particle-induced loss of crystal structure (i.e., zero dislocation growth).

More specifically, crystal pulling systems described herein include seed chuck assemblies designed to reduce and inhibit the formation of gas flow recirculation cells within crystal pulling systems that cause back transport of evaporated species from the melt to the upper dome and receiving chamber of crystal pulling systems. In some embodiments, for example, seed chuck assemblies are sized and shaped to restrict or constrain the amount of free or open space between the seed chuck assembly and other components within the hot zone of the crystal pulling system, such as cooling jackets or vertical baffles. Purge gas flow around the seed chuck assembly is thereby enhanced, causing separation between upper recirculation cells (e.g., recirculation cells within the ingot receiving chamber or proximate the upper dome) and lower recirculation cells (e.g., recirculation cells proximate the melt), and thereby reducing back transport of evaporated species to the upper dome and receiving chamber.

Additionally, in some embodiments, the seed chuck assemblies described herein include a flow guide connected to and positioned radially outward from a main body of the seed chuck assembly such that a flow path is formed between the main body and the flow guide. The flow guide is shaped complementary to an outer profile of the main body such that gas flowing through the flow path flows along the main body of the seed chuck assembly. As a result, gas flow separation and wake formation are inhibited, thereby inhibiting formation of recirculation cells proximate the melt and back transport of evaporated species. Additionally, in some embodiments, the flow guide includes an upper portion that extends upward and radially inward from a cylindrical or annular mid-section. The upper portion of the flow guide interrupts gas flow within the receiving chamber of crystal pulling systems, and thereby inhibits formation of recirculation cells within the receiving chamber and back transport of evaporated species to the receiving chamber.

Figure 1:
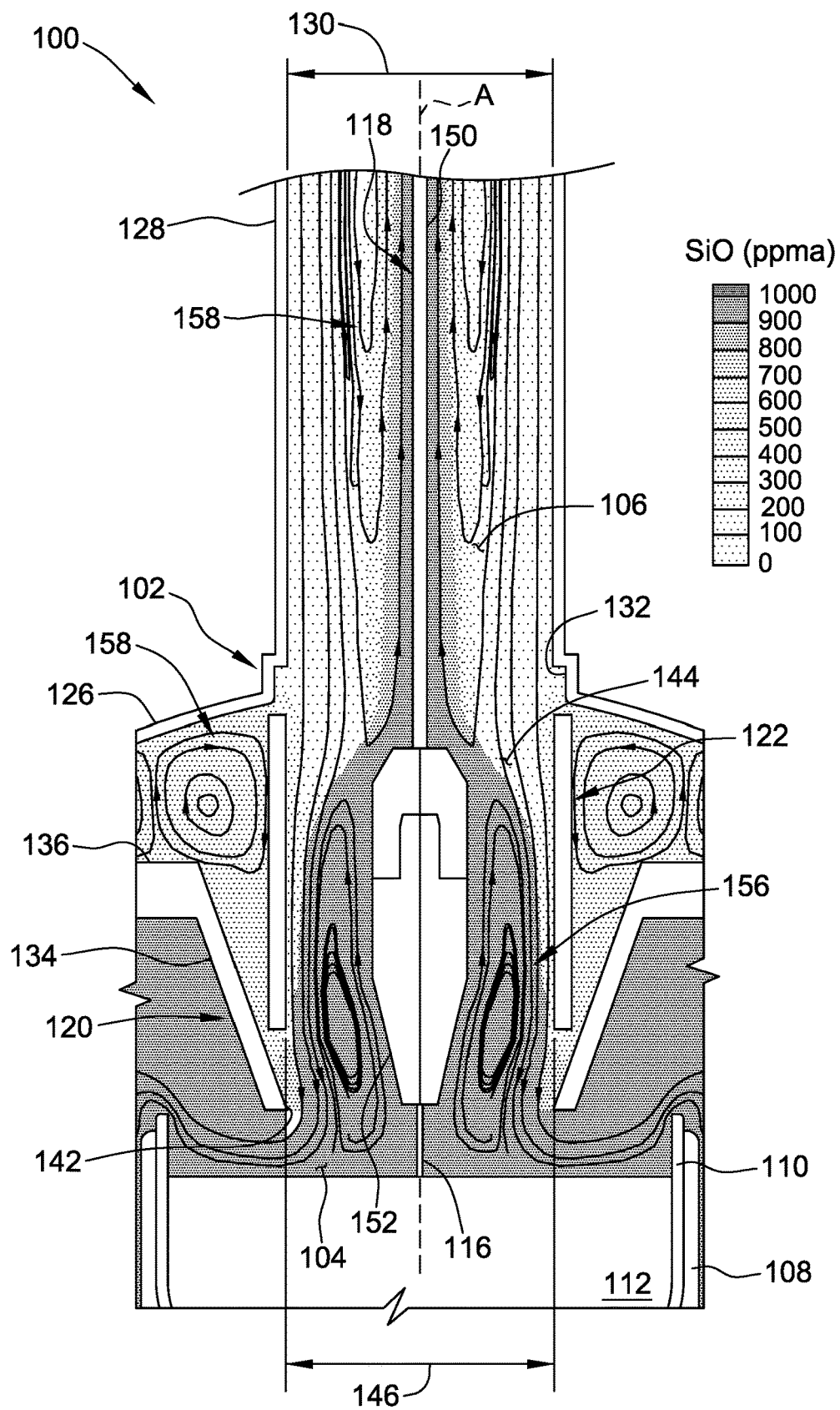
FIG. 1 is cross-section of an example crystal pulling system during a stabilization and seeding period of the Czochralski crystal growing process.

Referring to FIG. 1, a crystal pulling system is shown schematically and is indicated generally at 100. The crystal pulling system 100 is used to produce monocrystalline (i.e., single crystal) ingots of semiconductor or solar-grade material (e.g., silicon) by the Czochralski (CZ) method. The illustrated crystal pulling system 100 is configured for growing ingots in a batch or recharge CZ method, although the systems and methods disclosed herein may be used to grow monocrystalline ingots by a continuous CZ method.

The illustrated crystal pulling system 100 generally includes a housing 102 defining a growth chamber 104 and an ingot removal or receiving chamber 106 connected to and positioned above the growth chamber 104. A graphite support or susceptor 108 is supported by a rotatable shaft (not shown) within the growth chamber 104. A crucible 110 containing a melt 112 of semiconductor or solar-grade material (e.g., silicon) is supported within the growth chamber 104 by the susceptor 108. One or more heaters (not shown) are positioned proximate the susceptor 108 and/or crucible 110 for supplying thermal energy to the system 100. During the crystal growth process, a seed crystal 116 is lowered by a pulling mechanism 118 into contact with the melt 112 and then slowly raised from the melt 112. As the seed crystal 116 is slowly raised from the melt 112, atoms from the melt 112 align themselves with and attach to the seed crystal 116 to form the ingot. The system also includes a heat shield 120 configured to shield the ingot from radiant heat from the melt 112 to allow the ingot to solidify, and a cooling jacket 122 (broadly, a heat exchanger) configured to control the cooling rate of the ingot as the ingot is pulled from the melt.

The housing 102 includes a lower portion (not shown), an upper dome 126 connected to the lower portion, and an elongate tubular portion 128 extending generally upward from the upper dome 126. The growth chamber 104 is defined by the lower portion and the upper dome 126, and the ingot receiving chamber 106 is generally defined by the elongate tubular portion 128. The receiving chamber 106 has an inner diameter 130 suitably sized to receive an ingot therein. The upper dome 126 includes a central annular opening 132 through which the ingot is pulled into the ingot receiving chamber 106. The housing 102 may be made of stainless steel or other suitable materials. In some embodiments, one or more of the lower portion, the upper dome 126, and the tubular portion 128 may include fluid-cooled (e.g., water-cooled) stainless steel walls.

The crucible 110 is positioned within the growth chamber 104 and beneath the receiving chamber 106 such that the ingot can be pulled by the crystal pulling mechanism 118 through the central opening 132 in the upper dome 126 and into the receiving chamber 106. The crucible 110 may be made of, for example, quartz or any other suitable material that enables the crystal pulling system 100 to function as described herein. Further, the crucible 110 may have any suitable size that enables the crystal pulling system 100 to function as described herein.

The heat shield 120 is positioned adjacent the crucible 110, and separates the melt 112 from an upper portion of the system 100. The heat shield 120 is configured to shield the ingot from radiant heat generated by the melt 112 and heaters to allow the ingot to solidify. In the example embodiment, the heat shield 120 includes a conical member 134 extending radially inward and downward towards the melt 112 from a base member 136 secured to the housing 102. In other embodiments, the heat shield 120 may include a cylindrical member, or have any other suitable configuration that enables the crystal pulling system 100 to function as described herein. The heat shield 120 defines a central opening 142 sized and shaped to receive the ingot grown from the melt 112. In some embodiments, the heat shield 120, specifically, the conical member 134, is constructed of suitable heat reflective materials including, for example and without limitation, graphite, silicon carbide coated graphite, and high purity molybdenum.

The cooling jacket 122 is concentrically arranged with and positioned radially inward from the heat shield 120, and defines a central passage 144 for receiving an ingot as the ingot is pulled by the pulling mechanism 118 from the melt 112. The central passage 144 has an inner diameter 146 defined by the cooling jacket 122 and sized to receive an ingot therein. The cooling jacket 122 includes a cylindrical fluid-cooled housing that is fluidly connected with a suitable cooling fluid source, such as water, via a conduit (not shown) for receiving cooling fluid into the cooling jacket 122. The cooling jacket 122 is constructed from suitably thermally conductive materials such as, for example and without limitation, steel, although the cooling jacket 122 may be constructed from materials other than steel.

The pulling mechanism 118 generally includes a pull shaft or cable 150 operatively connected to a motor or other suitable drive mechanism (not shown) for raising and lowering the pull cable 150 and components connected to the pull cable 150 along a pull axis A (FIG. 1). A seed holder or chuck 152 is connected to one end of the pull cable 150 for holding the seed crystal 116 during the crystal growth process.

The heaters of the crystal pulling system 100 are configured to melt an initial charge of solid feedstock (such as chunk polysilicon), and maintain the melt 112 in a liquefied state after the initial charge is melted. The heaters are arranged at suitable locations about the crucible 110. In some embodiments, for example, one heater is positioned radially outward from and extends around a sidewall of the crucible 110. Moreover, in some embodiments, the heaters have a generally annular shape, although the heaters may have any suitable shape that enables the crystal pulling system 100 to function as described herein. The heaters may be any suitable heating device that enables the system 100 to function as described herein. In some embodiments, for example, the heaters are resistive heaters. Further, the system 100 may include any suitable number of heaters that enables the system 100 to function as described herein, such as one, two, or three heaters.

In some embodiments, the crystal pulling system 100 may also include a controller (not shown in FIG. 1) communicatively connected to various components of the system 100, such as the rotatable shaft (or a motor connected to the shaft), the pulling mechanism 118, and the heaters, for controlling operation of such components.

The crystal pulling system 100 also includes one or more gas inlets (not shown) for introducing an inert gas into the growth chamber 104, and one or more exhaust outlets (not shown) for discharging the inert gas and other gaseous and airborne particles from the growth chamber 104. The gas inlets may be positioned along the upper dome 126 of the housing 102 and along the tubular portion 128 defining the receiving chamber 106. The outlets are generally positioned along the lower portion of the housing, beneath the crucible 110 and susceptor 108.

FIG. 1 also illustrates computer simulated flow streamlines of a carrier or "purge" gas flowing through the crystal pulling system 100 during a stabilization and seeding period or phase of the crystal growth process. In the stabilization and seeding period, the seed chuck 152 is positioned at its lowest position during the growth process. Also shown in FIG. 1 is a computer simulated contour plot of the concentration of gaseous SiO within the crystal pulling system 100 during the stabilization and seeding period, wherein densely shaded areas indicate a relatively high concentration of gaseous SiO and sparsely shaded areas indicate a relatively low concentration of gaseous SiO.

Figure 2:
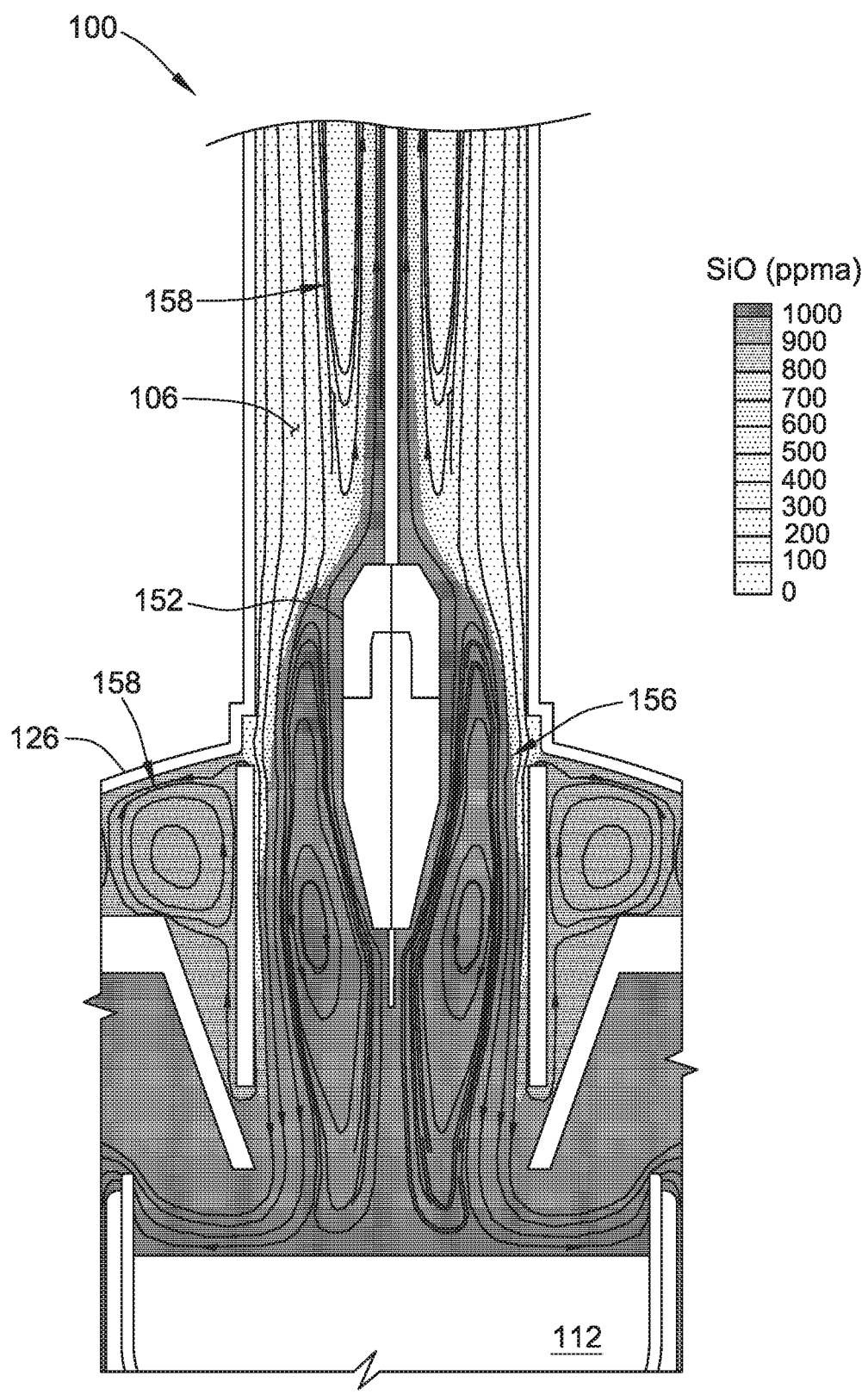
FIG. 2 is a cross-section of the crystal pulling system of FIG. 1 during a necking phase of the crystal growing process.

FIG. 2 shows the crystal pulling system 100 of FIG. 1 with the seed chuck 152 positioned at a height that corresponds to a necking phase of the crystal growth process. During the necking phase, a neck 154 (shown in FIG. 3) having a diameter similar to a diameter of the seed crystal 116 is grown. FIG. 2 also illustrates computer simulated flow streamlines of a carrier gas flowing through the crystal pulling system 100 during the necking phase, and a computer simulated contour plot of the concentration of gaseous SiO within the crystal pulling system 100 during the necking phase.

Figure 3:
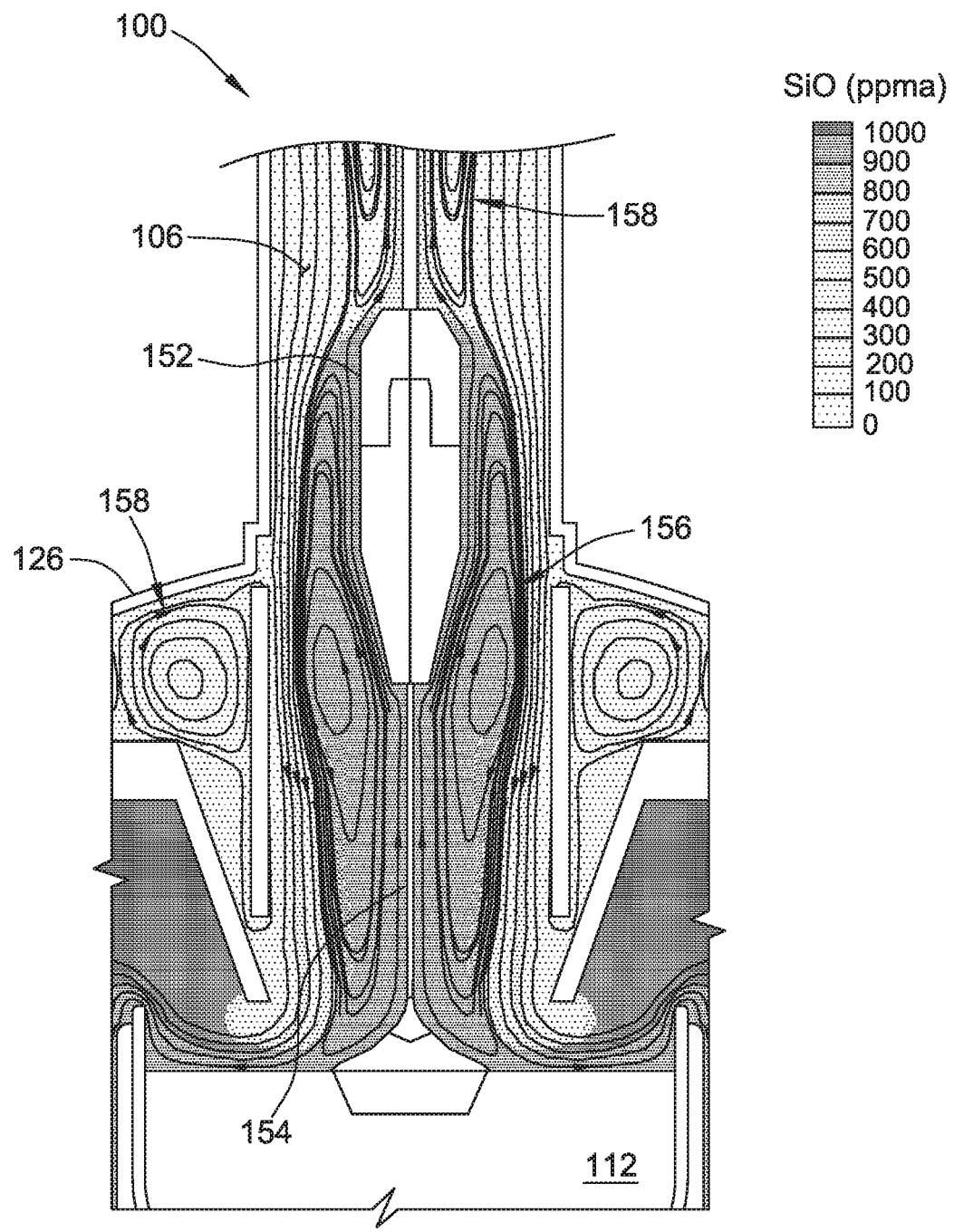
FIG. 3 is a cross-section of the crystal pulling system of FIG. 1 during a crown growth phase of the crystal growing process.

FIG. 3 shows the crystal pulling system 100 of FIG. 1 with the seed chuck 152 positioned at a height that corresponds to a crown growth phase of the crystal growth process. During the crown growth phase, the rate at which the seed crystal 116 is pulled from the melt 112 is gradually slowed to enlarge the diameter of the growing ingot, thereby forming a "crown" of the ingot. After the crown growth phase, a constant diameter portion of the ingot is grown. FIG. 3 also illustrates computer simulated flow streamlines of a carrier gas flowing through the crystal pulling system 100 during the crown growth phase, and a computer simulated contour plot of the concentration of gaseous SiO within the crystal pulling system 100 during the crown growth phase.

As shown in FIGS. 1-3, the concentration of gaseous SiO in upper portions of the crystal pulling system 100 during early stages of crystal growth (i.e., seeding, necking, and crown growth) can be relatively high. For example, the SiO concentration near the upper dome 126 and within the receiving chamber 106 can be 700-800 parts per million or higher during the seeding and necking stages of crystal growth, as shown in FIGS. 1 and 2. Such concentrations can result in significant SiO deposition on components of the crystal pulling system 100.

Without being bound by any particular theory, it is believed that recirculation cells formed within the crystal pulling system 100 during early stages of crystal growth contribute significantly to the transport of evaporated species from the melt, such as SiO, to upper portions of the crystal pulling system, such as near the upper dome 126 and within the receiving chamber 106. As shown in FIGS. 1-3, for example, inert gas flow through the crystal pulling system 100 forms lower recirculation cells 156 proximate the melt 112, and upper recirculation cells 158 near the upper dome 126 and within the receiving chamber 106. The lower recirculation cells 156 extend a significant distance upwards from the melt 112, and are thereby permitted to carry evaporated species from the melt 112 upwards to the upper recirculation cells 158 such that the evaporated species become entrained within the upper recirculation cells 158.

The lower recirculation cells 156 shown in FIGS. 1-3 are less prominent or not present at all during later stages of crystal growth. Without being bound by any particular theory, it is believed that the reduction and elimination of the lower recirculation cells 156 during later stages of crystal growth is the result of the growing ingot filling and thereby eliminating the free space available for flowing gas to form recirculation cells. Thus, deposition of oxide species and other species evaporated from the melt during early stages of crystal growth (i.e., seeding, necking, and crown growth) accounts for a significant portion of the overall deposition of evaporated species during the crystal growing process.

The crystal pulling systems of the present disclosure are designed to decouple lower recirculation cells from upper recirculation cells, and to inhibit and/or eliminate the formation of recirculation cells within the crystal pulling system, particularly during early stages of crystal growth.

Figure 4:
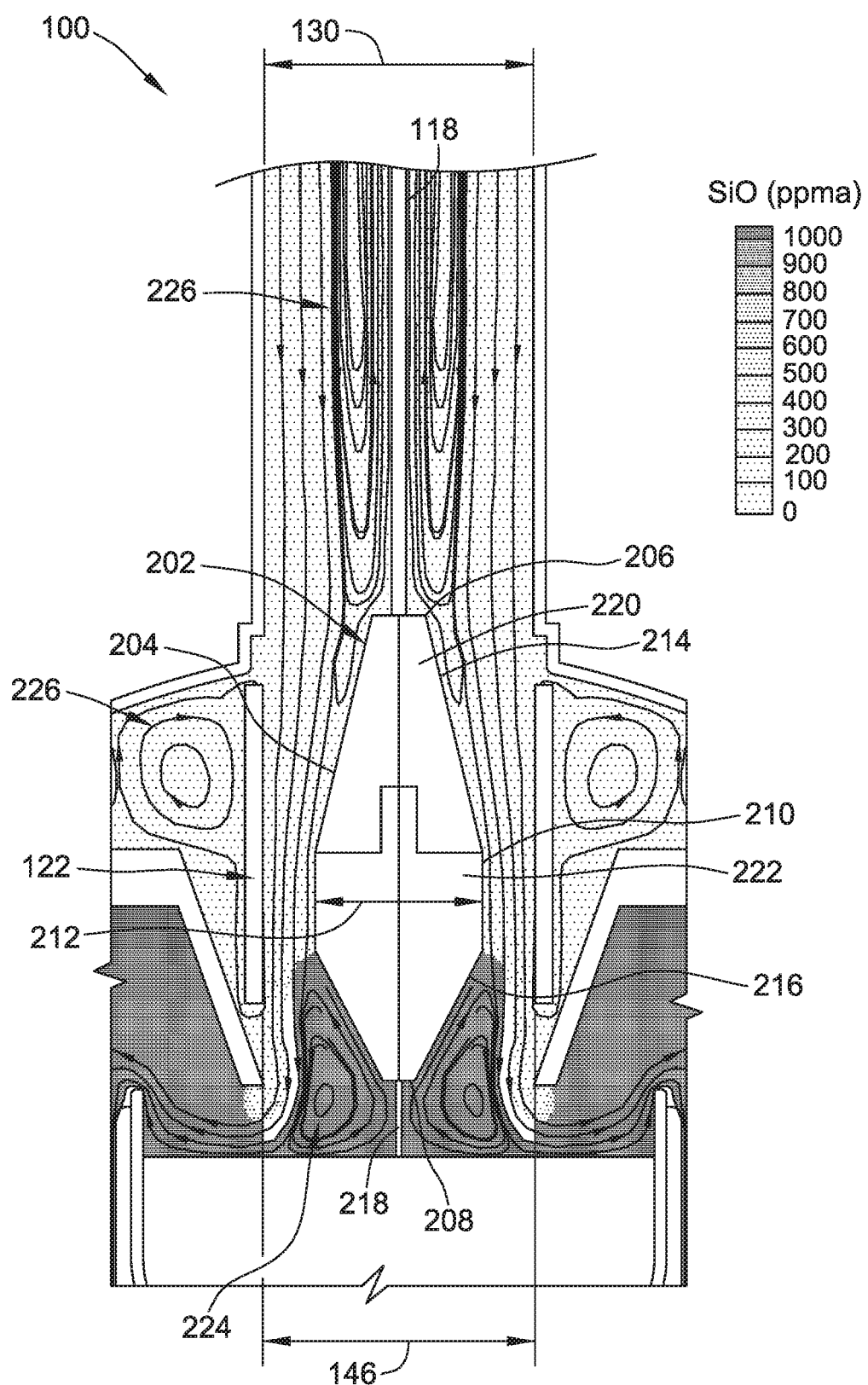
FIG. 4 is a cross-section of the crystal pulling system of FIG. 1 including an example embodiment of a seed chuck assembly designed to facilitate reducing and eliminating the formation of recirculation cells within the crystal pulling system.

Referring to FIG. 4, for example, the crystal pulling system 100 of FIG. 1 is shown with a seed chuck assembly 202 designed to facilitate reducing formation of recirculation cells within the crystal pulling system 100. Specifically, the seed chuck assembly 202 includes a main body 204 having a first end 206 connected to the pulling mechanism 118, a second end 208 opposite the first end 206, a cylindrical mid-portion 210 defining an outer diameter 212 of the seed chuck assembly 202, an upper conical portion 214 extending from the first end 206 to the mid-portion 210, and a lower conical portion 216 extending from the mid-portion 210 to the second end 208. The upper conical portion 214 tapers radially outward from the first end 206 to the mid-portion 210, and the lower conical portion 216 tapers radially inward from the mid-portion 210 to the second end 208.

The seed chuck assembly 202 also includes a fastening mechanism (not shown) configured to secure a seed crystal 218 proximate to the second end 208 of the main body 204. In one suitable embodiment, for example, the main body 204 has a bore (not shown) defined in the second end 208 configured to receive the seed crystal 218 therein, and radially adjustable jaws configured to secure (i.e., clamp) the seed crystal 218 within the bore. Other embodiments may include any suitable fastening mechanism that enables the seed chuck assembly 202 to function as described herein.

In the embodiment illustrated in FIG. 4, the seed chuck assembly 202 (specifically, the main body 204) has a two-part construction including an upper portion 220 constructed of quartz and a lower portion 222 constructed of graphite, although the seed chuck assembly 202 may have any other suitable construction that enables the seed chuck assembly 202 to function as described herein.

The outer diameter 212 of the seed chuck assembly 202 illustrated in FIG. 4 is relatively large as compared to other, standard-sized seed chucks, such as the seed chuck 152 shown in FIGS. 1-3. In particular, the ratio between the outer diameter 212 of the seed chuck assembly 202 and the inner diameter 146 of the cooling jacket 122 is in the range of 0.6 to 1.0, and, more suitably, in the range of 0.6 to 0.85. Additionally, the ratio between the outer diameter 212 of the seed chuck assembly 202 and the inner diameter 130 of the receiving chamber 106 is in the range of 0.6 to 1.0, and, more suitably, in the range of 0.6 to 0.85.

The size of the outer diameter 212 of the seed chuck assembly 202 relative to other components of the crystal pulling system 100, such as the cooling jacket 122 and the receiving chamber 106, is critical in that it provides optimal gas flow around the seed chuck assembly 202 for inhibiting the formation of recirculation cells within the crystal pulling system 100. For example, where the ratio between the outer diameter 212 of the seed chuck assembly 202 and the inner diameter 130 of the cooling jacket 122 is at least 0.6, gas flow around seed chuck is enhanced and open space available for flowing purge gas to form recirculation cells is reduced, thereby inhibiting formation of recirculation cells. Additionally, where the ratio is less than 1.0, and more suitably less than 0.85, enhanced gas flow around the seed chuck assembly 202 is limited so as to not induce turbulent flow vibrations of components within the crystal pulling system 100, such as the cooling jacket 122, which might otherwise cause deposits to dislodge and result in loss of zero dislocation crystal growth.

Figure 5:
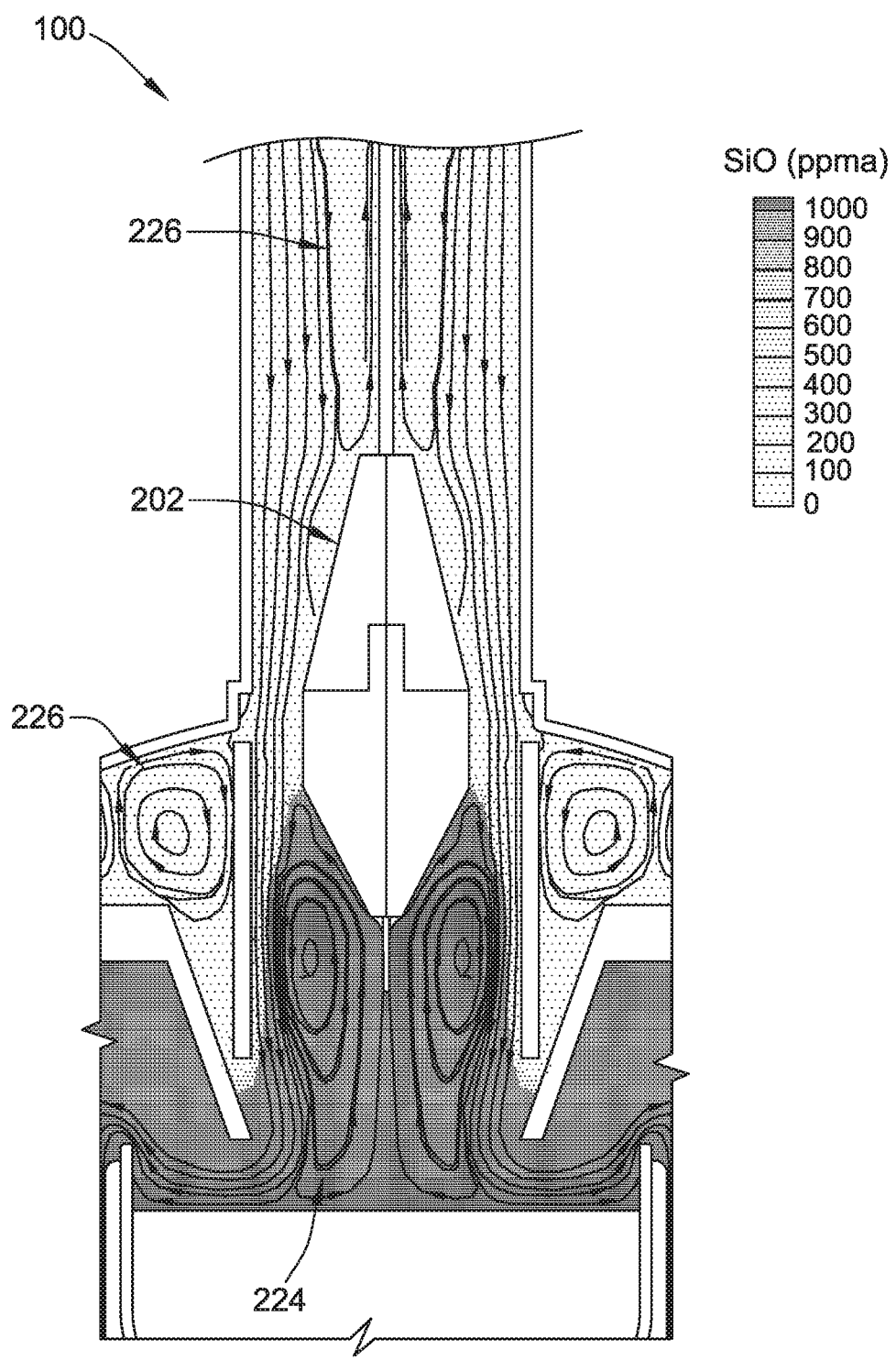
FIG. 5 is a cross-section of the crystal pulling system of FIG. 4 during a necking phase of the crystal growth process.

The seed chuck assembly 202 is shown at a position that corresponds to the stabilization and seed phase of the crystal growing process in FIG. 4. FIG. 5 shows the crystal pulling system 100 with the seed chuck assembly 202 positioned at a height that corresponds to the necking phase of the crystal growth process, and FIG. 6 shows the crystal pulling system 100 with the seed chuck assembly 202 positioned at a height that corresponds to the crown growth phase of the crystal growth process.

Figure 6:
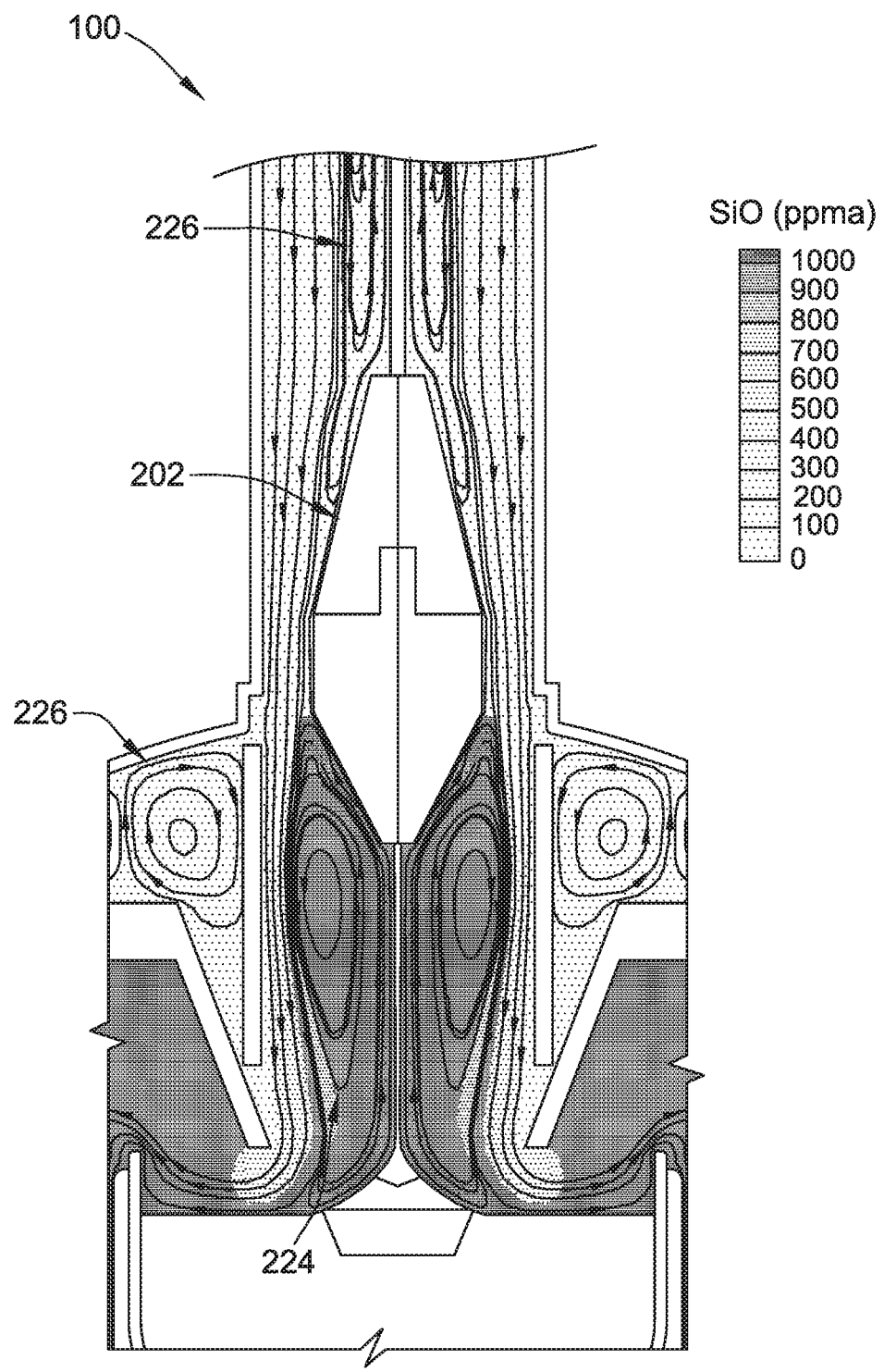
FIG. 6 is a cross-section of the crystal pulling system of FIG. 4 during a crown growth phase of the crystal growth process.

FIGS. 4-6 also illustrate computer simulated flow streamlines of a carrier gas flowing through the crystal pulling system 100 including the seed chuck assembly 202 during the stabilization and seed phase, the necking phase, and the crown growth phase, respectively. FIGS. 4-6 also illustrate computer simulated contour plots of the concentration of gaseous SiO within the crystal pulling system 100 including the seed chuck assembly 202 during the stabilization and seed phase, the necking phase, and the crown growth phase, respectively.

As shown in FIGS. 4-6, lower recirculation cells 224 formed within the crystal pulling system 100 including the seed chuck assembly 202 are significantly smaller during the early stages of crystal growth (i.e., seeding, necking, and crown growth) than the lower recirculation cells 156 that form when the standard-sized seed chuck 152 is used. As a result, coupling (i.e., mass transport) between the lower recirculation cells 224 and upper recirculation cells 226 is significantly reduced and, consequently, the concentration of gaseous SiO transported to upper portions of the crystal pulling system 100 during early stages of crystal growth (i.e., seeding, necking, and crown growth) are significantly reduced as compared to the crystal pulling system 100 including the standard-sized seed chuck 152.

Additionally, the cooling jacket 122 acts as a baffle in the embodiments shown in FIGS. 4-6. In particular, the cooling jacket 122 constricts purge gas flow along the outer profile of the main body 204, and inhibits radially outward gas flow along a portion of the growth chamber 104. As such, the cooling jacket 122 is also referred to herein as a vertically-extending baffle. In some embodiments, the cooling jacket 122 is omitted, and a vertically-extending baffle is disposed within the growth chamber 104 in a position similar to that of the cooling jacket.

Figure 7:
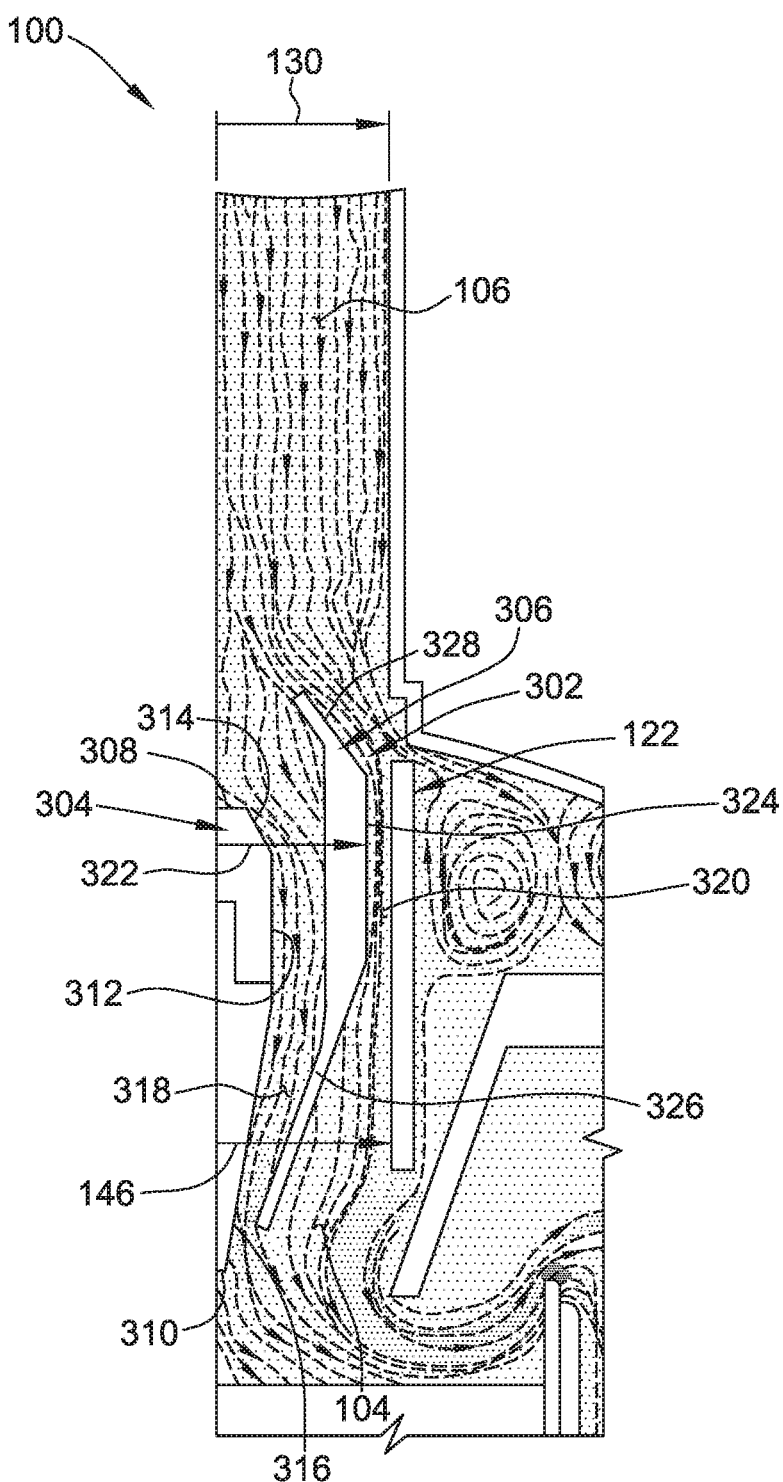
FIG. 7 is a partial cross-section of the crystal pulling system of FIG. 1 including another embodiment of a seed chuck assembly designed to facilitate reducing and eliminating the formation of recirculation cells within the crystal pulling system.

FIG. 7 is a partial cross-section of the crystal pulling system 100 of FIG. 1 shown with another embodiment of a seed chuck assembly 302 designed to facilitate reducing formation of recirculation cells within the crystal pulling system 100. Specifically, in the embodiment illustrated in FIG. 7, the seed chuck assembly 302 includes a main body 304 and a flow guide 306.

The main body 304 includes a first end 308 connected to a pulling mechanism, such as the pulling mechanism 118 shown in FIG. 4, a second end 310 opposite the first end 308, a cylindrical mid-portion 312, an upper conical portion 314 extending from the first end 308 to the mid-portion 312, and a lower conical portion 316 extending from the mid-portion 312 to the second end 310. The upper conical portion 314 tapers radially outward from the first end 308 to the mid-portion 312, and the lower conical portion 316 tapers radially inward from the mid-portion 312 to the second end 310. The main body 304 includes a fastening mechanism (not shown) configured to secure a seed crystal proximate to the second end 310 of main body 304. In one suitable embodiment, for example, the main body 304 has a bore (not shown) defined in the second end 310 configured to receive the seed crystal therein, and radially adjustable jaws configured to secure (i.e., clamp) the seed crystal within the bore. Other embodiments may include any suitable fastening mechanism that enables the seed chuck assembly 302 to function as described herein.

As shown in FIG. 7, the flow guide 306 is connected to and disposed radially outward from the main body 304 such that a radial inner flow passage 318 is defined between the main body 304 and the flow guide 306. Further, when the seed chuck assembly 302 is positioned in the growth chamber 104, the flow guide 306 defines a radial outer flow passage 320 between the flow guide 306 and the cooling jacket 122.

The flow guide 306 may be connected to the main body 304 using any suitable connector(s) that enables the seed chuck assembly 302 to function as described herein. In some embodiments, for example, a plurality of circumferentially-spaced arms extend from the main body 304 radially outward to the flow guide 306 to connect the flow guide 306 to the main body 304.

The flow guide 306 is constructed from suitable high temperature, inert materials including, for example and without limitation, graphite and quartz. In other embodiments, the flow guide 306 may be constructed from materials other than graphite and quartz.

The flow guide 306 defines an outer diameter 322 of the seed chuck assembly 302, only a portion of which is shown in FIG. 7. Similar to the seed chuck assembly 202 shown in FIGS. 4-6, the outer diameter 322 of the seed chuck assembly 302 illustrated in FIG. 7 is relatively large as compared to other, standard-sized seed chucks, such as the seed chuck 152 shown in FIGS. 1-3. In particular, the ratio between the outer diameter 322 of the seed chuck assembly 302 and the inner diameter 146 of the cooling jacket 122 is in the range of 0.6 to 1.0, and, more suitably, in the range of 0.6 to 0.85.

Additionally, the ratio between the outer diameter 322 of the seed chuck assembly 302 and the inner diameter 130 of the receiving chamber 106 is in the range of 0.6 to 1.0, and, more suitably, in the range of 0.6 to 0.85. As described above with reference to FIGS. 4-6, the size of the outer diameter 322 of the seed chuck assembly 302 relative to other components of the crystal pulling system 100, such as the cooling jacket 122 and the receiving chamber 106, is critical in that it provides optimal gas flow around the seed chuck assembly 302 for inhibiting the formation of recirculation cells within the crystal pulling system 100.

In the embodiment illustrated in FIG. 7, the flow guide 306 is shaped complementary to an outer profile of the main body 304, and includes a cylindrical, constant diameter mid-portion 324 defining the outer diameter 322 of the seed chuck assembly 302, a lower conical portion 326 extending downward and radially inward from the cylindrical mid-portion 324, and an upper conical portion 328 extending upward and radially inward from the cylindrical mid-portion 324.

The lower conical portion 326 and the upper conical portion 328 facilitate inhibiting the formation of recirculation cells within the crystal pulling system 100. For example, the lower conical portion 326 is oriented substantially parallel to the outer profile of the main body 304, specifically the lower conical portion 316 of the main body 304. The lower conical portion 326 of the flow guide 306 acts similar to a spoiler of a motor vehicle in that it maintains gas flow against the main body 304 of the seed chuck assembly 302, and thereby prevents flow separation and wake formation.

In some embodiments, the lower conical portion 326 of the flow guide 306 is oriented parallel to the lower conical portion 316 of the main body 304. In other embodiments, such as the embodiment illustrated in FIG. 7, the lower conical portion 326 of the flow guide 306 is oriented at an angle of up to 20 degrees relative to the lower conical portion 316 of the main body 304. In other embodiments, the lower conical portion 326 of the flow guide 306 may be oriented at any suitable angle that enables the flow guide 306 and seed chuck assembly 302 to function as described herein.

The upper conical portion 328 of the flow guide 306 extends upward from the mid-portion 324 into upper portions of the crystal pulling system 100, such as the receiving chamber 106. The upper conical portion 328 thereby interrupts gas flow within the receiving chamber 106, and inhibits formation of recirculation cells within the receiving chamber 106 and back transport of evaporated species to the receiving chamber 106. In the embodiment illustrated in FIG. 7, the upper conical portion 328 is oriented at an angle of about 45° relative to the mid-portion 324. In other embodiments, the upper conical portion 328 is oriented at an angle of between 25° and 65° relative to the mid-portion 324. In yet other embodiments, the upper conical portion 328 may be oriented at any suitable angle that enables the flow guide 306 and the seed chuck assembly 302 to function as described herein.

The lower conical portion 326 of the flow guide 306 is also configured to permit line-of-sight visibility of a melt-crystal interface for imaging devices, such as video cameras and thermal sensors, positioned outside the growth chamber 104. In particular, the lower conical portion 326 is oriented at a suitable angle and has a suitable thickness to permit direct line-of-sight of the melt-crystal interface for imaging devices positioned outside the growth chamber 104. In the illustrated embodiment, for example, the lower conical portion 326 has a thickness less than a thickness of the mid-portion 324 to permit direct line-of-sight of the melt-crystal interface for imaging devices positioned outside the growth chamber 104.

In other embodiments, one or both of the lower conical portion 326 and the upper conical portion 328 may be omitted such that the flow guide 306 includes only the cylindrical, constant diameter portion mid-portion 324.

Figure 8:
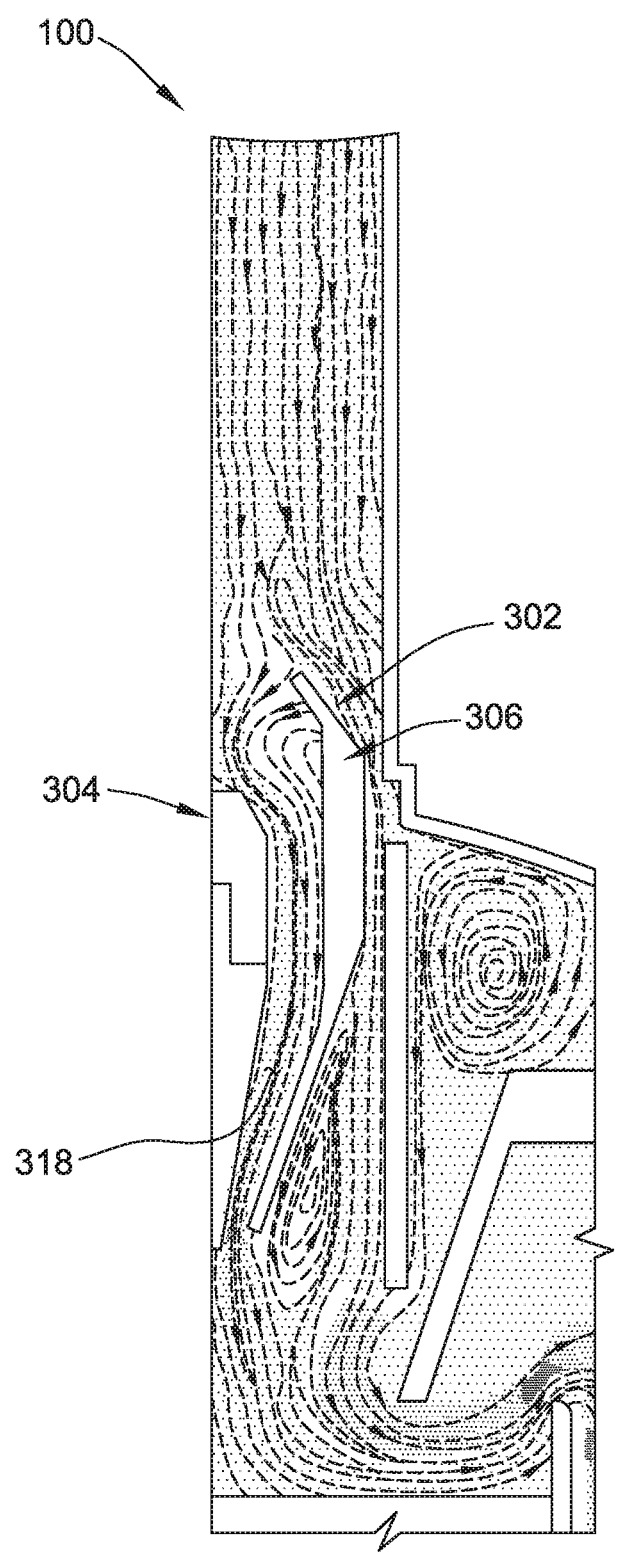
FIG. 8 is a cross-section of the crystal pulling system of FIG. 7 during a necking phase of the crystal growth process.

The seed chuck assembly 302 is shown at a position that corresponds to the stabilization and seed phase of the crystal growing process in FIG. 7. FIG. 8 shows the crystal pulling system 100 including the seed chuck assembly 302 positioned at a height that corresponds to the necking phase of the crystal growth process, and FIG. 9 shows the crystal pulling system 100 including the seed chuck assembly 302 positioned at a height that corresponds to the crown growth phase of the crystal growth process.

Figure 9:
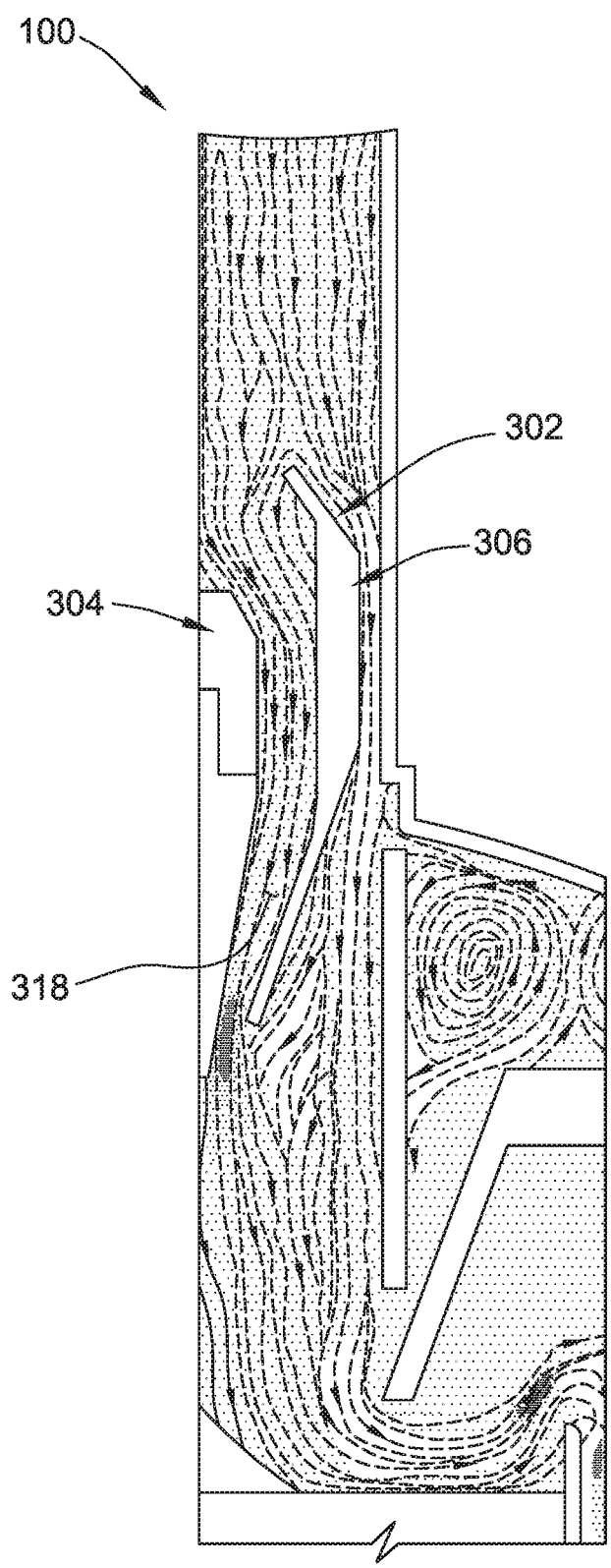
FIG. 9 is a cross-section of the crystal pulling system of FIG. 7 during a crown growth phase of the crystal growth process.

FIGS. 7-9 also illustrate computer simulated flow streamlines of a carrier gas flowing through the crystal pulling system 100 including the seed chuck assembly 302 during the stabilization and seed phase, the necking phase, and the crown growth phase, respectively. FIGS. 7-9 also illustrate computer simulated contour plots of the flow velocity of the carrier gas within the crystal pulling system 100 including the seed chuck assembly 302 during the stabilization and seed phase, the necking phase, and the crown growth phase, respectively.

As shown in FIGS. 7-9, the lower recirculation cells 156 and the upper recirculation cells 158 present in the crystal pulling system 100 including the seed chuck 152 shown in FIGS. 1-3 are not present in the crystal pulling system 100 that includes the seed chuck assembly 302. As a result, back transport of evaporated species from the melt 112 and deposition of such species on components of the crystal pulling system 100 are significantly reduced. Without being bound by any particular theory, it is believed that seed chuck assembly 302 prevents formation of the recirculation cells by limiting the open space available for flowing gas to form recirculation cells, by dividing gas flow into radial inner and outer flow paths, and by maintaining gas flow along the main body 304 of the seed chuck assembly 302.

As noted above, seed chucks of the present disclosure are designed based on gas flow considerations within the crystal pulling system, and are specifically designed to reduce and inhibit the formation of recirculation cells within the crystal pulling system. Seed chucks disclosed herein differ from conventional seed chucks, which are typically designed to optimize the size and/or weight of the seed chuck relative to a growing crystal. Such conventional seed chuck design typically resulted in seed chuck diameters much smaller than crystal ingots grown with the seed chuck in order to optimize weight distribution between the seed chuck and the growing crystal, and to address orbital issues resulting from rotation of the seed chuck and the crystal ingot during ingot growth. Conventional wisdom discouraged modification of seed chucks, e.g., by increasing the size of the seed chuck, as such design modifications were known to require significant experimentation to ensure a proper size and weight ratio between the seed chuck and the growing crystal. Thus, seed chuck assemblies of the present disclosure are based on design principles that are contrary to accepted wisdom.

Additionally, increasing the size of the seed chuck results in narrowing gas flow paths around the seed chuck, and thereby enhances gas flow around the seed chuck. This is known to induce turbulent flow vibrations on components of crystal pulling systems, such as cooling jackets, which can dislodge deposits formed on such components and result in loss of crystal structure. This is particularly an issue for components with openings or cutouts, such as cooling jackets. Seed chuck assemblies of the present disclosure overcome these issues by directing high velocity gas flow along components of the crystal pulling system without cutouts and/or with little to no deposit build-up. In particular, seed chuck assemblies of the present disclosure include flow guides that are free from openings or cutouts and that direct high velocity flow between the flow guide and a main body of the seed chuck assembly. Thus, high velocity gas flow is primarily restricted to flow paths between the main body of the seed chuck assembly and the flow guide, both of which are free from cutouts and have little to no deposit build-up.

Embodiments of the crystal pulling systems described herein provide several advantages over known crystal pulling systems. For example, the crystal pulling systems of the present disclosure reduce particle-induced loss of crystal structure (i.e., zero dislocation growth) by reducing formation of deposits on components of crystal pulling systems, such as the upper dome and the ingot receiving chamber.

More specifically, crystal pulling systems described herein include seed chuck assemblies designed to reduce and inhibit the formation of gas flow recirculation cells within crystal pulling systems. In some embodiments, for example, seed chuck assemblies are sized and shaped to restrict or constrain the amount of free or open space between the seed chuck assembly and other components within the hot zone of the crystal pulling system, such as cooling jackets or vertical baffles. Purge gas flow around the seed chuck assembly is thereby enhanced, causing separation between upper recirculation cells (e.g., recirculation cells within the ingot receiving chamber or proximate the upper dome) and lower recirculation cells (e.g., recirculation cells proximate the melt), and thereby reducing back transport of evaporated species to the upper dome and receiving chamber.

Additionally, in some embodiments, the seed chuck assemblies described herein include a flow guide connected to and positioned radially outward from a main body of the seed chuck assembly such that a flow path is formed between the main body and the flow guide. The flow guide is shaped complementary to an outer profile of the main body such that gas flowing through the flow path flows along the main body of the seed chuck assembly. As a result, gas flow separation and wake formation are inhibited, thereby inhibiting formation of recirculation cells proximate the melt and back transport of evaporated species. Additionally, in some embodiments, the flow guide includes an upper portion that extends upward and radially inward from a cylindrical or annular mid-section. The upper portion of the flow guide interrupts gas flow within the receiving chamber of crystal pulling systems, and thereby inhibits formation of recirculation cells within the receiving chamber and back transport of evaporated species to the receiving chamber.

Additionally, by eliminating recirculation cells, turbulent and oscillating gas flow associated with such recirculation cells is eliminated. The seed chuck assemblies described herein thereby reduce turbulent flow induced vibrations of crystal puller components, and the risk of dislodging deposits formed on such components.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A crystal pulling system for growing a monocrystalline ingot from a melt of semiconductor or solar-grade material, the system comprising:
a crucible for containing the melt of semiconductor or solar-grade material;
a pulling mechanism configured to pull the ingot from the melt; and
a seed chuck assembly connected to the pulling mechanism, the seed chuck assembly including:
a main body; and
a flow guide directly connected to and disposed radially outward from the main body such that a flow passage is defined between the flow guide and the main body, the flow guide having an outlet through which gas is discharged from the flow passage directly into a space that extends vertically between the melt and the flow guide, the flow passage directing gas downward toward the surface of the melt, the seed chuck assembly being configured to, at the outlet of the flow passage, direct gas downward toward the surface of the melt without directing gas radially outward, the flow guide including a cylindrical constant diameter mid-portion, a lower conical portion extending downward and radially inward from the mid-portion, and an upper conical portion extending upward and radially inward from the cylindrical portion.

2. The crystal pulling system of claim 1, wherein the lower portion has a thickness less than a thickness of the mid-portion.

3. The crystal pulling system of claim 1, wherein the flow guide is shaped such that gas flowing through the flow path flows along the main body of the seed chuck assembly.

4. The crystal pulling system of claim 3, wherein the outer profile of the main body extends radially outward from a first end of the main body to a mid-portion of the main body, and extends radially inward from the mid-portion of the main body to a second end of the main body opposite the first end.

5. The crystal pulling system of claim 1, wherein the flow guide is constructed from at least one of graphite and quartz.

6. The crystal pulling system of claim 1, further comprising a vertically-extending baffle disposed within the growth chamber and having an inner diameter defining a central passage for receiving the ingot as the ingot is pulled by the pulling mechanism.

7. The crystal pulling system of claim 6, wherein the flow guide defines an outer diameter of the seed chuck assembly, and wherein a ratio between the outer diameter of the seed chuck assembly and the inner diameter of the baffle is at least 0.6 and less than 1.0.

8. The crystal pulling system of claim 7, wherein the vertically-extending baffle is a cooling jacket.

9. A crystal pulling system for growing a monocrystalline ingot from a melt of semiconductor or solar-grade material, the system comprising:
a crucible for containing the melt of semiconductor or solar-grade material;
a pulling mechanism configured to pull the ingot from the melt; and
a seed chuck assembly connected to the pulling mechanism, the seed chuck assembly including:
a main body; and
a flow guide directly connected to and disposed radially outward from the main body such that a flow passage is defined between the flow guide and the main body, the flow guide having an outlet through which gas is discharged from the flow passage, the flow passage directing gas downward toward the surface of the melt, the system being free of structures in a region that extends vertically between the outlet of the flow guide and the surface of the melt, the flow guide including a cylindrical constant diameter mid-portion, a lower conical portion extending downward and radially inward from the mid-portion, and an upper conical portion extending upward and radially inward from the cylindrical portion.

10. A crystal pulling system for growing a monocrystalline ingot from a melt of semiconductor or solar-grade material, the system comprising:
a crucible for containing the melt of semiconductor or solar-grade material;
a pulling mechanism configured to pull the ingot from the melt; and
a seed chuck assembly connected to the pulling mechanism, the seed chuck assembly including:
a main body; and
a flow guide directly connected to and disposed radially outward from the main body such that a flow passage is defined between the flow guide and the main body, the flow guide having an outlet through which gas is discharged from the flow passage, the flow passage directing gas downward toward the surface of the melt, the seed chuck assembly being configured to, at the outlet of the flow passage, direct gas downward toward the surface of the melt without directing gas radially outward, a portion of the flow guide being vertically higher than the main body, the flow guide including a cylindrical constant diameter mid-portion, a lower conical portion extending downward and radially inward from the mid-portion, and an upper conical portion extending upward and radially inward from the cylindrical portion.

11. The crystal pulling system of claim 1, further comprising a seed crystal disposed and connected to the main body of the seed chuck assembly, wherein at least a portion of the seed crystal is vertically lower than the flow guide.

12. The crystal pulling system of claim 1, wherein a portion of the main body is vertically lower than the flow guide.

13. The crystal pulling system of claim 1, wherein the seed chuck assembly includes a plurality of circumferentially-spaced arms that extend from the main body radially outward to the flow guide to connect the flow guide to the main body.

14. The crystal pulling system of claim 9, further comprising a seed crystal disposed and connected to the main body of the seed chuck assembly, wherein at least a portion of the seed crystal is vertically lower than the flow guide.

15. The crystal pulling system of claim 9, wherein a portion of the main body is vertically lower than the flow guide.

16. The crystal pulling system of claim 9, wherein the seed chuck assembly includes a plurality of circumferentially-spaced arms that extend from the main body radially outward to the flow guide to connect the flow guide to the main body.

17. The crystal pulling system of claim 10, further comprising a seed crystal disposed and connected to the main body of the seed chuck assembly, wherein at least a portion of the seed crystal is vertically lower than the flow guide.

18. The crystal pulling system of claim 10, wherein a portion of the main body is vertically lower than the flow guide.

19. The crystal pulling system of claim 10, wherein the seed chuck assembly includes a plurality of circumferentially-spaced arms that extend from the main body radially outward to the flow guide to connect the flow guide to the main body.

* * * * *